(12) United States Patent
Yuan et al.

(10) Patent No.: US 10,643,711 B1
(45) Date of Patent: May 5, 2020

(54) WORKLOAD BASED DYNAMIC ERASE SUSPEND ADAPTATION

(71) Applicant: Western Digital Technologies, Inc., San Jose, CA (US)

(72) Inventors: Jingfeng Yuan, Livermore, CA (US); Xiaocheng Chen, Dublin, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/228,599

(22) Filed: Dec. 20, 2018

(51) Int. Cl.
*G11C 16/16* (2006.01)
*G11C 16/32* (2006.01)
*G11C 16/26* (2006.01)

(52) U.S. Cl.
CPC .............. *G11C 16/16* (2013.01); *G11C 16/26* (2013.01); *G11C 16/32* (2013.01)

(58) Field of Classification Search
CPC ..... G11C 16/00; G11C 16/0483; G11C 16/14; G11C 16/16; G11C 16/3472; G11C 16/349; G11C 16/3495; G11C 29/82
USPC ........................................ 365/185.24, 185.29
See application file for complete search history.

(56) References Cited

U.S. PATENT DOCUMENTS

| | | | |
|---|---|---|---|
| 5,805,501 A | 9/1998 | Shiau et al. | |
| 8,364,888 B2 | 1/2013 | Melik-Martirosian et al. | |
| 9,183,937 B2 | 11/2015 | Chen et al. | |
| 9,223,514 B2 | 12/2015 | Hyun et al. | |
| 9,443,599 B2 | 9/2016 | Yi et al. | |
| 9,679,658 B2 | 6/2017 | Pelster et al. | |
| 9,779,038 B2 | 10/2017 | Kasorla et al. | |
| 9,886,214 B2 | 2/2018 | Micheloni et al. | |
| 2013/0198451 A1* | 8/2013 | Hyun ............ | G06F 3/0652 711/114 |
| 2016/0210050 A1* | 7/2016 | Hyun ............ | G06F 3/0611 |
| 2017/0168752 A1* | 6/2017 | Micheloni ....... | G06F 3/0652 |
| 2018/0024772 A1 | 1/2018 | Madraswala et al. | |

OTHER PUBLICATIONS

Leetch, Greg, "Simultaneous read/write or suspend/resume? Do you know when to choose?", accessed Apr. 12, 2018 at http://core.spansion.com/article/page/4/; 10 pages.
Wu et al, "Reducing SSD Read Latency via NAND Flash Program and Erase Suspension", Journal of Systems Architecture 60(4); DOI: 10.1016/j.syarc.2013.12.002; https://www.usenix.org/legacy/event/fast12/tech/full_papers/Wu.pdf; 7 pages.

* cited by examiner

*Primary Examiner* — Alexander Sofocleous
*Assistant Examiner* — Alfredo Bermudez Lozada
(74) *Attorney, Agent, or Firm* — Loza & Loza, LLP; Gabriel Fitch

(57) ABSTRACT

Aspects relate to dynamically adapting the number of erase suspend operations on a non-volatile memory (NVM) based on the workload. In some aspects, erase suspend optimization involves computing a workload statistic based on at least read operations performed on the NVM over time, setting a maximum number of erase suspend operations allowed to be performed when the workload statistic compares favorably to a workload threshold, and preventing erase suspend operations from being performed when the workload statistic compares unfavorably to the workload threshold.

17 Claims, 9 Drawing Sheets

WORKLOAD BASED DYNAMIC ERASE SUSPEND ADAPTATION

FIELD

The disclosure relates, in some aspects, to non-volatile memory (NVM) devices and memory controllers for use therewith. More specifically, but not exclusively, the disclosure relates to erase suspend operations on an NVM device.

INTRODUCTION

Solid state devices (SSDs) incorporating non-volatile memories (NVMs), such as flash NAND memories, are replacing or supplementing conventional rotating hard disk drives for mass storage in many consumer or industrial electronics and computers. In a typical SSD product, a host computing device includes or communicates with an SSD controller that in turn controls access to one or more of the NVM devices.

The SSD controller handles host requests such as host write requests and host read requests to respectively write data to and read data from an NVM array of the SSD. The SSD controller further handles host erase requests to erase data from the NVM array. The execution time of erase operations is longer than that of read and write operations. Therefore, performance of read/write commands arriving at the SSD controller during execution of an erase operation may suffer a latency penalty (e.g., several milliseconds). The latency penalty or delay may diminish the Quality of Service (QoS) provided by the SSD.

To minimize the latency of read and write operations, the SSD controller may be configured to prioritize read and write requests over erase requests by implementing an erase suspend feature that allows the SSD controller to suspend the erase operation to enable execution of the read/write operation. Once the read/write operation is complete, the SSD controller may then resume the erase operation.

However, frequent erase suspend operations may result in a QoS penalty on the SSD due to erase time loss. In addition, the NVM may be more prone to errors from word line disturb when the SSD controller frequently executes erase suspend operations during ramp up of the erase voltage. In view of the above, it would be advantageous to dynamically adapt the rate of erase suspend operations.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

One aspect of the disclosure provides a data storage apparatus that includes a non-volatile memory and a processor coupled to the non-volatile memory. In one example, the processor is configured to: compute a workload statistic based on at least read operations performed on the non-volatile memory over a duration of time, compare the workload statistic with a workload threshold, set a maximum number of erase suspend operations greater than zero that are allowed to be performed within each of a plurality of erase pulses of an erase operation when the workload statistic compares favorably to the workload threshold, and prevent erase suspend operations from being performed within any of the plurality of erase pulses when the workload statistic compares unfavorably to the workload threshold.

One aspect of the disclosure provides a data storage method. In one example, the method includes: determining a number of read operations performed on a non-volatile memory over a duration of time; computing a workload statistic based on at least the number of read operations; comparing the workload statistic with a workload threshold; setting a maximum number of erase suspend operations greater than zero that are allowed to be performed within each of a plurality of erase pulses of an erase operation when the workload statistic compares favorably to the workload threshold; and preventing erase suspend operations from being performed within any of the plurality of erase pulses when the workload statistic compares unfavorably to the workload threshold.

One aspect of the disclosure provides a data storage apparatus. In one example, the apparatus includes: means for computing a workload statistic including one of an average interval between consecutive read operations performed during a duration of time, an average number of read operations performed during the duration of time, or a ratio of write operations to read operations performed during the duration of time; means for comparing the workload statistic with a workload threshold; means for setting a maximum number of erase suspend operations greater than zero that are allowed to be performed within each of a plurality of erase pulses of an erase operation when the workload statistic compares favorably to the workload threshold; and means for preventing erase suspend operations from being performed within any of the plurality of erase pulses when the workload statistic compares unfavorably to the workload threshold.

These and other aspects of the disclosure will become more fully understood upon a review of the detailed description, which follows. Other aspects, features, and implementations of the disclosure will become apparent to those of ordinary skill in the art, upon reviewing the following description of specific implementations of the disclosure in conjunction with the accompanying figures. While features of the disclosure may be discussed relative to certain implementations and figures below, all implementations of the disclosure can include one or more of the advantageous features discussed herein. In other words, while one or more implementations may be discussed as having certain advantageous features, one or more of such features may also be used in accordance with the various implementations of the disclosure discussed herein. In similar fashion, while certain implementations may be discussed below as device, system, or method implementations it should be understood that such implementations can be implemented in various devices, systems, and methods.

BRIEF DESCRIPTION OF THE DRAWINGS

A more particular description is included below with reference to specific aspects illustrated in the appended drawings. Understanding that these drawings depict only certain aspects of the disclosure and are not therefore to be considered to be limiting of its scope, the disclosure is described and explained with additional specificity and detail through the use of the accompanying drawings, in which.

DETAILED DESCRIPTION

Figure 1:
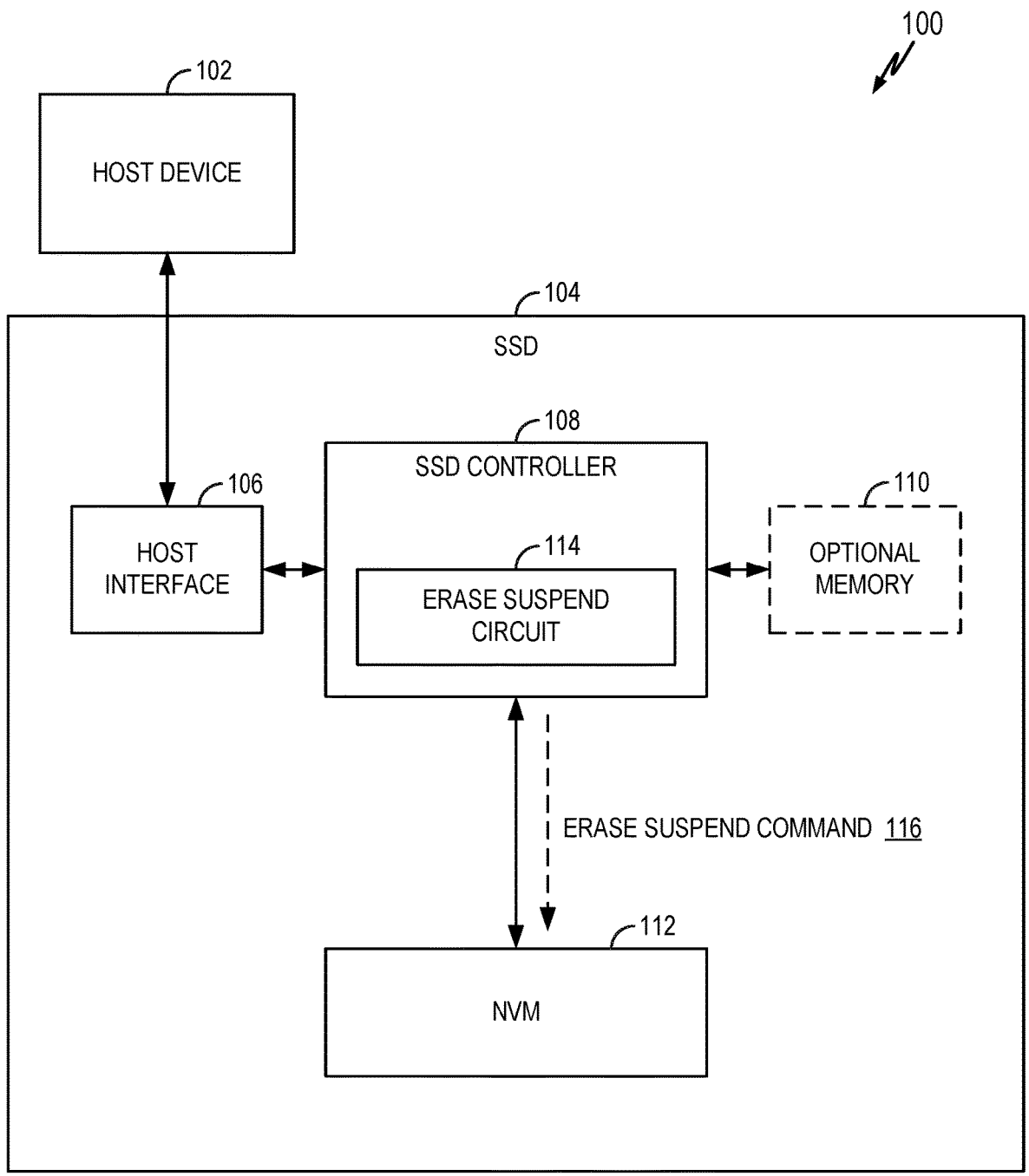
FIG. 1 illustrates an example memory system including a solid state device (e.g., an SSD) configured in accordance with one or more aspects of the disclosure.

In the following detailed description, reference is made to the accompanying drawings, which form a part thereof. In addition to the illustrative aspects, aspects, and features described above, further aspects, aspects, and features will become apparent by reference to the drawings and the following detailed description. The description of elements in each figure may refer to elements of proceeding figures. Like numbers may refer to like elements in the figures, including alternate aspects of like elements.

The disclosure relates in some aspects to various apparatuses, systems, methods, and media for dynamically adapting the rate of erase suspends on an NVM. For example, an SSD controller, a memory controller, a programmer device, or some other suitable device may compute a workload statistic indicative of the workload experienced by the NVM over time and set a maximum number of erase suspend operations allowed to be performed based on the workload statistic. In some examples, the workload statistic may be compared to a workload threshold, and the SSD controller may prevent erase suspend operations from being performed when the workload statistic compares unfavorably to the workload threshold.

For purposes of illustration, various aspects of the disclosure will be described in the context of a memory system that includes NAND memory technology. A NAND device may be referred to herein as a NAND Flash memory, a NAND memory device, a NAND flash, or a NAND. Generally speaking, a NAND device is a non-volatile memory having high storage density, fast access time, low power requirements in operation and advantageous shock resistance, compared to more conventional memory platforms. Raw NAND devices may be equipped (e.g., configured) with a serial interface such as Open NAND Flash Interface (ONFi), Common Flash Memory Interface (CFI), and the like. NAND devices may be configured as discrete memory chips or packaged with a controller to form a secure digital (SD) memory card, Multi Media Card (MMC), or a solid state disk. A NAND device may be configured with a single flash die, or a plurality of dies. In addition to memory cells, a NAND device may include other components, such as control/address logic components, I/O components, and data register components. It should be appreciated that the teachings herein are also applicable to other forms of memory (e.g., NVM other than NAND devices).

In NAND devices, it has been observed that the impact of the erase suspend feature on the QoS is dependent upon the queue depth (QD) and workload experienced by the NAND device. The QD refers to the number of host read requests waiting to be executed by the SSD controller. When the QD is low and the read workload is not intensive, implementing the erase suspend feature to allow execution of read/write operations may improve the QoS. However, in high QD applications and/or when the read workload is high, a higher QoS may be achieved with a fewer number of allowed erase suspends.

For conventional NAND devices, the erase suspend feature is either turned on or turned off irrespective of the actual workload. In view of the above deficiencies, the disclosure relates in some aspects to a method for dynamically adapting the number of allowed erase suspend operations based on the workload. In some aspects, erase suspend optimization in accordance with the teachings herein involves a method for computing a workload statistic based on a least read operations performed on the NVM over time, setting a maximum number of erase suspend operations allowed to be performed when the workload statistic compares favorably to a workload threshold, and preventing erase suspend operations from being performed when the workload statistic compares unfavorably to the workload threshold. These aspects and other aspects of the disclosure will now be described in more detail in conjunction with FIGS. 1-9.

Example Memory System

FIG. 1 illustrates an aspect of a memory system 100 that includes a host device 102 and an SSD 104 communicatively coupled to the host device 102. In one aspect, the SSD 104 may be a solid state drive. The host device (e.g., a host computer) 102 provides commands to the SSD 104 for transferring data between the host device 102 and the SSD 104. For example, the host device 102 may provide a write command to the SSD 104 for writing data to the SSD 104 or a read command to the SSD 104 for reading data from the SSD 104. The host device 102 may be any system or device having a need for data storage or retrieval and a compatible interface for communicating with the SSD 104. For example, the host device 102 may a computing device, a personal computer, a portable computer, or workstation, a server, a personal digital assistant, a digital camera, a digital phone, or the like.

A data storage device/apparatus, such as the SSD 104, may include a host interface 106, an SSD controller 108, an optional memory 110, and a non-volatile memory (NVM) 112, such as a NAND device. The NVM 112 may be made up of one or more non-volatile memory die. As used herein, the term die refers to the set of non-volatile memory cells, and associated circuitry for managing the physical operation of those non-volatile memory cells, that are formed on a single semiconductor substrate.

The host interface 106 is coupled to the SSD controller 108 and facilitates communication between the host device 102 and the SSD controller 108. Additionally, the SSD controller 108 is coupled to the memory 110 and the NVM 112. The host interface 106 may be any type of communication interface, such as an Integrated Drive Electronics (IDE) interface, a Universal Serial Bus (USB) interface, a Serial Peripheral (SP) interface, an Advanced Technology Attachment (ATA) interface, a Small Computer System Interface (SCSI), an IEEE 1394 (Firewire) interface, or the like. In some aspects, the host device 102 includes the SSD 104 (e.g., the host device 102 and the SSD 104 are implemented as a single component). In other aspects, the SSD 104 is remote with respect to the host device 102 or is contained in a remote computing system coupled in communication with the host device 102. For example, the host device 102 may communicate with the SSD 104 through a wireless communication link.

The SSD controller 108 controls operation of the SSD 104. In various aspects, the SSD controller 108 receives commands from the host device 102 through the host interface 106 and performs the commands to transfer data between the host device 102 and the NVM 112. Each command, therefore, results in the execution/performance of an associated operation (e.g., a read operation, write/program operation, erase operation, etc.). In addition, the SSD controller 108 performs internal operations such as garbage collection operations, data integrity operations, and wear leveling operations. The SSD controller 108 may include any type of processing device, such as a microprocessor, a microcontroller, an embedded controller, a logic circuit, software, firmware, or the like, for controlling operation of the SSD 104.

In some aspects, some or all of the functions described herein as being performed by the SSD controller 108 may instead be performed by another element of the SSD 104. For example, the SSD 104 may include a microprocessor, a microcontroller, an embedded controller, a logic circuit, software, firmware, or any kind of processing device, for performing one or more of the functions described herein as being performed by the SSD controller 108. In some aspects, one or more of the functions described herein as being performed by the SSD controller 108 are instead performed by the host device 102. In some aspects, some or all of the functions described herein as being performed by the SSD controller 108 may instead be performed by another element such as a controller in a hybrid drive including both non-volatile memory elements and magnetic storage elements.

The memory 110 may be any memory, computing device, or system capable of storing data. For example, the memory 110 may be a random-access memory (RAM), a dynamic random-access memory (DRAM), a static random-access memory (SRAM), a synchronous dynamic random-access memory (SDRAM), a flash storage, an erasable programmable read-only-memory (EPROM), an electrically erasable programmable read-only-memory (EEPROM), or the like. In various aspects, the SSD controller 108 uses the memory 110, or a portion thereof, to store data during the transfer of data between the host device 102 and the NVM 112. For example, the memory 110 or a portion of the memory 110 may be a cache memory.

The SSD controller 108 includes an erase suspend circuit 114 for generating an erase suspend command 116 to the NVM 112 to suspend an erase operation currently being performed on the NVM 112. For example, the SSD controller 108 may instruct the erase suspend circuit 114 to generate the erase suspend command 116 upon receiving a read command and/or write command from the host device 102 during execution of an erase command on the NVM 112.

In some aspects, the SSD controller 108 may set a maximum number of erase suspend commands allowed to be generated (or, similarly, erase suspend operations allowed to be performed) within a single erase pulse of an erase operation. For example, the SSD controller 108 may compute a workload statistic indicative of the workload of the NVM 112 over time and set the maximum number of erase suspend commands/operations based on the workload statistic. Examples of workload statistics computed by the SSD controller 108 may include, but are not limited to, an average interval between consecutive read operations performed over a duration of time, an average number of read operations performed over the duration of time, or a ratio of write operations to read operations (or a ratio of read operations to write operations) performed over the duration of time. The duration of time may be any suitable time interval, and in some examples, may be between 5 seconds and 1 minute.

In some examples, the SSD controller 108 may compare the computed workload statistic to a workload threshold. In aspects in which the workload statistic includes an average read interval, the workload threshold may be a read interval threshold that is between, for example, 10 µs-100 µs. The SSD controller 108 may set the maximum number of erase suspend commands/operations when the workload statistic compares favorably to the workload threshold. The maximum number of erase suspends may be any suitable number, and in some examples, may be between one and twenty erase suspends. The SSD controller 108 may further prevent erase suspend commands from being generated (or, similarly, erase suspend operations from being performed) when the workload statistic compares unfavorably to the workload threshold.

For example, when the workload statistic includes an average read interval, the SSD controller 108 may set the maximum number of erase suspend command/operations when the average read interval is longer than (e.g., greater than or equal to) the read interval threshold, and thus compares favorably to the read interval threshold. Similarly, the SSD controller 108 may prevent erase suspend commands from being generated when the average read interval is shorter than (e.g., less than) the read interval threshold, and thus compares unfavorably to the read interval threshold.

As another example, when the workload statistic includes an average number of read operations, the workload threshold may be a read number threshold. In this example, the SSD controller 108 may set the maximum number of erase suspend command/operations when the average number of read operations is less than the read number threshold, and thus compares favorably to the read number threshold. Similarly, the SSD controller 108 may prevent erase suspend commands from being generated when the average number of read operations is greater than or equal to the read number threshold, and thus compares unfavorably to the read number threshold.

Example Data Storage Device

Figure 2:
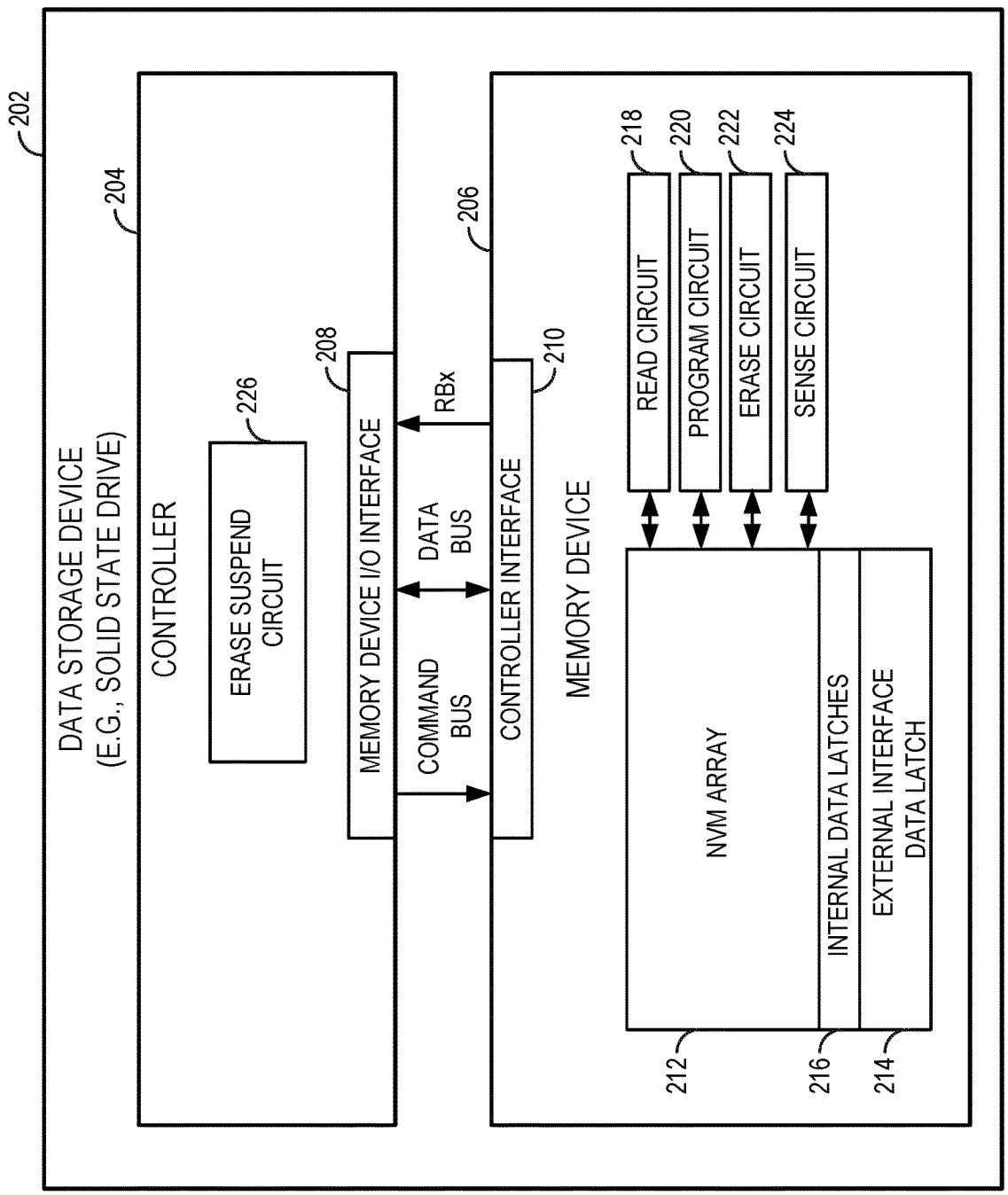
FIG. 2 illustrates an example data storage device (e.g., an SSD) configured in accordance with one or more aspects of the disclosure.

FIG. 2 illustrates an aspect of a data storage device 202 (e.g., an SSD drive) that may dynamically adapt the number of erase suspends as taught herein. The data storage device 202 includes a controller 204 that writes data to and reads data from a memory device 206 (e.g., an NVM), and performs other associated data storage operations. For example, the data storage device 202 may correspond to the SSD 104 shown in FIG. 1, the controller 204 may correspond to the SSD controller 108 shown in FIG. 1, and the memory device 206 may correspond to the NVM 112 shown in FIG. 1.

The controller 204 and the memory device 206 communicate with one another via corresponding interfaces. The controller 204 includes a memory device input/output (I/O) interface 208 for sending commands to the memory device (e.g., via a command bus), sending data to and receiving data from the memory device 206 (e.g., via a data bus), and for sending and receiving other signaling as applicable (e.g., a read/busy indication (RBx) generated by the memory device 206). Similarly, the memory device 206 includes a controller interface 210 for receiving commands from the controller 204 (e.g., via a command bus), sending data to and receiving data from the controller 204 (e.g., via a data bus), and for sending and receiving other signaling as applicable (e.g., RBx).

The memory device 206 includes an NVM array 212 for storing data, an external interface data latch 214 for outputting stored data to and receiving data to be stored from the controller interface 210, and a set of internal data latches 216 for storing operational data that is used by the memory device 206. In some examples, the external interface data latch 214 includes a plurality of sets of data latches, where each data latch represents a page in width. For example, for a NVM array 212 arranged to store n bits per page, each set of data latches may include N data latches where each data latch can store 1 bit of data. The memory device 206 also includes a read circuit 218 for reading data from the NVM array 212, a program circuit 220 for writing data to the NVM array 212, and an erase circuit 222 for erasing data in the NVM array 212. The memory device 206 may further include sense circuitry 224, which may include an array of sense modules operating in parallel to sense the current in each NVM memory cell of a page of memory cells in the NVM array 212. For example, each sense module may include a sense amplifier to detect whether a conduction current of a memory cell in communication with a respective sense module is above or below a reference level.

NVM array 212 includes non-volatile memory cells used to store data. The non-volatile memory cells may be any suitable non-volatile memory cells, including NAND flash memory cells and/or NOR flash memory cells in a two-dimensional and/or three-dimensional configuration. For example, the memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion. The non-volatile flash memory array in the non-volatile memory may be arranged in blocks of memory cells. A block of memory cells is the unit of erase, i.e., the smallest number of memory cells that are physically erasable together. The individual blocks are in turn divided for operational purposes into pages of memory cells. A page is the unit of data programming within a block, containing the minimum amount of data that can be programmed at one time. The minimum unit of data that can be read at one time may be less than a page.

In an example in which the memory cells are MLC cells configured to store two bits of data, each bit of the two bits of data may represent a page bit of a lower page or a page bit of an upper page, where the lower page and upper page span across a series of memory cells sharing a common word line. Typically, the less significant bit of the two bits of data represents a page bit of a lower page and the more significant bit of the two bits of data represents a page bit of an upper page. Within a particular MLC cell, a value of "11" corresponds to an un-programmed state or erase state of the memory cell. When the program circuit 220 applies programming pulses to the memory cell to program a page bit of the lower page, the level of charge is increased to represent a value of "10" corresponding to a programmed state of the page bit of the lower page. For a page bit of an upper page, when the page bit of the lower page is programmed (a value of "10"), the program circuit 220 applies programming pulses to the memory cell for the page bit of the upper page to increase the level of charge to correspond to a value of "00" or "10" depending on the desired value of the page bit of the upper page. However, if the page bit of the lower page is not programmed such that the memory cell is in an un-programmed state (a value of "11"), applying programming pulses to the memory cell to program the page bit of the upper page increases the level of charge to represent a value of "01" corresponding to a programmed state of the page bit of the upper page.

During an erase operation, the erase circuit 222 returns the memory cells in a block to the erased state (e.g., a value of "11"). An erase operation may be implemented by the erase circuit 222 applying a series of voltage (erase) pulses to the memory cells in the block being erased. In some examples, the erase state for a cell may be assumed to be reached after a predetermined number of erase pulses have been applied, or after an erase voltage has been applied for a predetermined period of time. In other examples, the status of the cells may be verified by the erase circuit 222 applying an erase verify voltage to the block to confirm that the cells have been erased.

The controller 204 further includes an erase suspend circuit 226 that may be configured to suspend an erase operation currently being performed on a block of memory cells in the NVM array 212. For example, the erase suspend circuit 226 may correspond to the erase suspend circuit 114 of FIG. 1 and perform one or more of the erase suspend-related operations described herein. In some aspects, the controller 204 may instruct the erase suspend circuit 226 to generate an erase suspend command to the memory device 206 to cause the erase circuit 222 to interrupt an erase operation upon receiving one or more read commands and/or write commands from the host during execution of the erase operation. For example, the erase suspend command may be generated during one of the erase pulses of the erase operation. After suspension of the erase operation, the controller 204 may instruct the read circuit 218 on the memory device 206 to execute the one or more read commands to read data out of the memory cells in the NVM array 212 and/or the program circuit 220 to execute the one or more write commands to write data to the memory cells in the NVM array 212. The controller 204 may then instruct the erase circuit 222 to resume the erase pulse of the erase operation.

In some aspects, the controller 204 may set a maximum number of erase suspend commands allowed to be generated (or, similarly, erase suspend operations allowed to be performed) within a single erase pulse of an erase operation or may prevent erase suspend operations from being performed within an erase pulse of an erase operation based on the current workload experienced by the memory device 206. The workload may be based, for example, on the queue depth (QD) of the controller 204 and at least the number of read commands received over a duration of time. The QD of the controller 204 may be determined by the host device and may be defined as the number of host read requests waiting to be executed by the controller 204. In some examples, the QD may be configurable by the host device over time based on the read workload of the host device. In general, the QD may be any suitable value, and in some examples, may be between 1 and 128.

In some examples, the controller 204 may compute a workload statistic indicative of the workload of the memory device 206 over time. The controller 204 may then compare the computed workload statistic to a workload threshold. If the workload statistic compares favorably to the workload threshold, the controller 204 may set the maximum number of erase suspend commands/operations. The controller 204 may further prevent erase suspend commands from being generated (or, similarly, erase operations from being performed) when the workload statistic compares unfavorably to the workload threshold.

Figure 3:
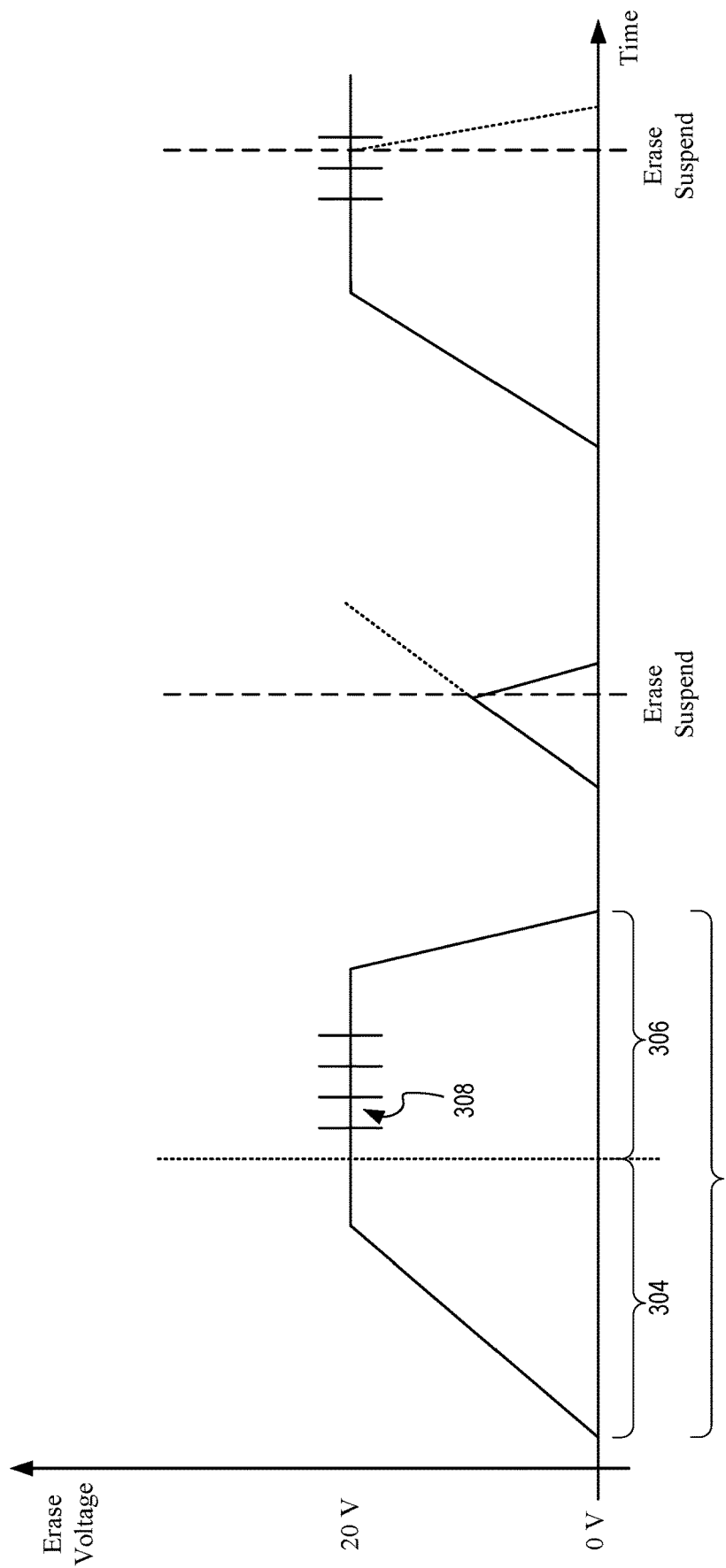
FIG. 3 illustrates examples of erase suspend operations in accordance with one or more aspects of the disclosure.

In some examples, the controller 204 may be configured with two or more workload thresholds, each associated with a different maximum number of erase suspend commands/operations. For example, a first workload threshold may be associated with a first maximum number of erase suspend commands/operations and a second workload threshold greater than the first workload threshold may be associated with a second maximum number of erase suspend commands/operations that is less than the first maximum number of erase suspend commands/operations. Thus, when the workload statistic compares favorably to the first workload threshold, the controller 204 may set the maximum number of erase suspend commands/operations to the first maximum number of erase suspend commands/operations. In addition, when the workload statistic compares unfavorably to the first workload threshold and compares favorably to the second workload threshold, the controller 204 may set the maximum number of erase suspend commands/operations to the second maximum number of erase suspend commands/operations. In some examples, the first maximum number of erase suspend commands/operations may be twenty erase suspend commands/operations, and the second maximum number of erase suspend commands/operations may be less than twenty erase suspend commands Example Erase Suspend Operations FIG. 3 illustrates examples of erase suspend operations for a NAND flash memory cell. An erase operation includes a series of voltage (erase) pulses 302. Each erase pulse 302 may be decomposed into two sections, including a ramp-up section 304 and an erase section 306. Within the ramp-up section 304, the erase voltage ramps up from 0 V to approximately 20 V or other suitable erase voltage. The erase section 306 includes a plurality of zones 308. In some examples, the erase section 306 may include thirty-two zones 308.

An erase suspend command may be received during either the ramp-up section 304, as illustrated in the second erase pulse shown in FIG. 3, or within the erase section 306, as illustrated in the third erase pulse shown in FIG. 3. If the erase suspend command is received during the ramp-up section 304, the erase voltage returns to zero and the erase pulse is restarted from the beginning of the ramp-up section upon resuming the erase operation. However, frequent erase suspend operations performed during the ramp-up section may result in excessive word line disturb, which may result in the NAND device being more prone to errors.

If the erase suspend command is received during one of the zones 308 in the erase section 306, the erase voltage may be maintained by the controller and the erase pulse continued from the previous zone upon resuming the erase operation. Thus, the controller does not need to re-enter the ramp-up section upon resuming the erase operation. For example, if the erase suspend command is received during the second zone 308, the controller may maintain the erase voltage at 20 V and resume the erase pulse at the beginning of the second zone upon resuming the erase operation. However, frequent erase suspend operations performed within the erase section 306 may result in a QoS penalty on the NAND device as a result of the longer erase time.

Therefore, in various aspects, the controller may optimize the number of erase suspend operations that may be performed during an erase pulse 302 of an erase operation based on the workload experienced by the NAND device. For example, the controller may set a maximum number of erase suspend operations that may be performed during an erase pulse 302 of an erase operation based on the workload. As another example, the controller may prevent erase suspend operations from occurring during any of the erase pulses 302 of the erase operation when the NAND device is experiencing an intensive workload. In this example, the controller may only allow read operations to occur between erase pulses. The number of read operations that may be allowed between erase pulses may include any suitable number of read operations based on the QD of the controller.

Example QoS Impacts of Erase Suspend Operations

Figure 4A:
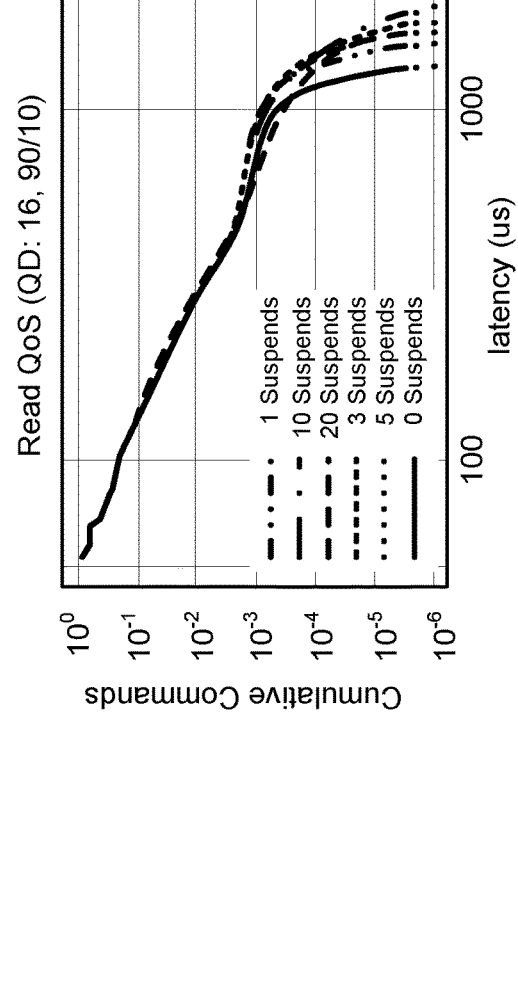
FIGS. 4A-4C illustrate example quality of service (QoS) impacts of erase suspend operations under different workloads accordance with one or more aspects of the disclosure.
Figure 4B:
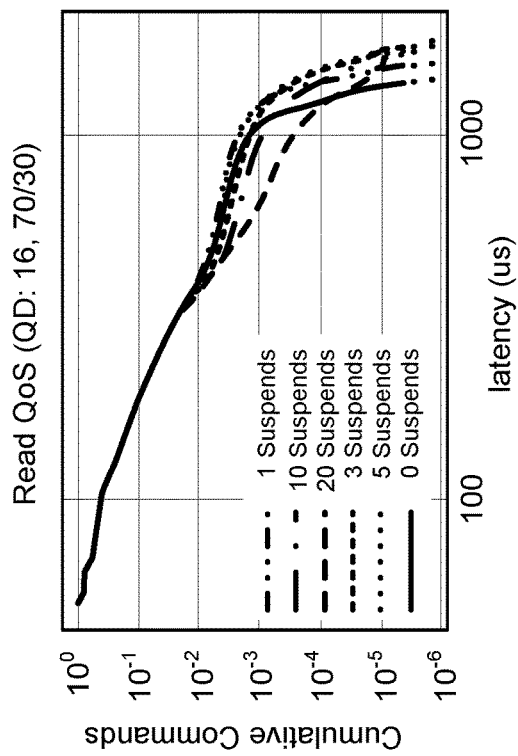
Figure 4C:
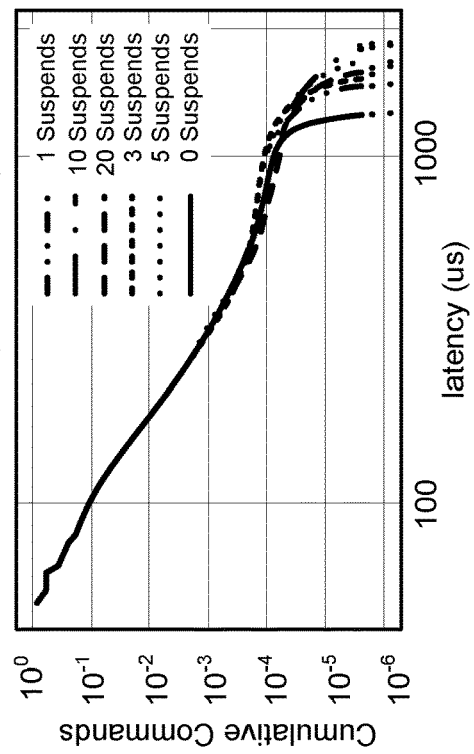

FIGS. 4A-4C illustrate example QoS impacts of erase suspend operations under different NAND workloads. FIGS. 4A-4C each depict the read latency (in µs) of the NAND device based on the probability of receiving cumulative read commands during an erase pulse of an erase operation for different maximum numbers of allowed erase suspend operations during the erase pulse. For example, the QoS impacts of 1, 3, 5, 10, 20, and no erase suspend operations allowed during an erase pulse are shown in FIGS. 4A-4C.

In each of FIGS. 4A-4C, the controller has a queue depth (QD) of 16. FIG. 4A depicts a random read to random write (R/W) ratio workload of 70/30, FIG. 4B depicts an R/W ratio workload of 90/10, and FIG. 4C depicts an R/W ratio workload of 99/1. Thus, FIG. 4A depicts a normal read-intensive workload, whereas FIG. 4C depicts a high read-intensive workload. As can be seen in FIG. 4A, increasing the number of erase suspend operations allowed during an erase pulse may reduce the latency for normal R/W ratio workloads. However, as can be seen in FIG. 4C, increasing the number of erase suspend operations allowed during an erase pulse does not improve the latency for high R/W ratio workloads. Instead, in the example shown in FIG. 4C, the QoS (latency) improves with lower numbers of (or no) erase suspend operations allowed during an erase pulse.

Therefore, in various aspects, the controller may dynamically adapt the maximum number of erase suspend operations allowed to be performed during an erase pulse of an erase operation based on the current NAND device workload. In some examples, the controller may set a high erase suspend limit (e.g., a high maximum number of erase suspend operations allowed) when the read workload is normal or low. In addition, the controller may set a low erase suspend limit or prevent erase suspend operations from being performed when the read workload is intensive.

Example Apparatus

Figure 5:
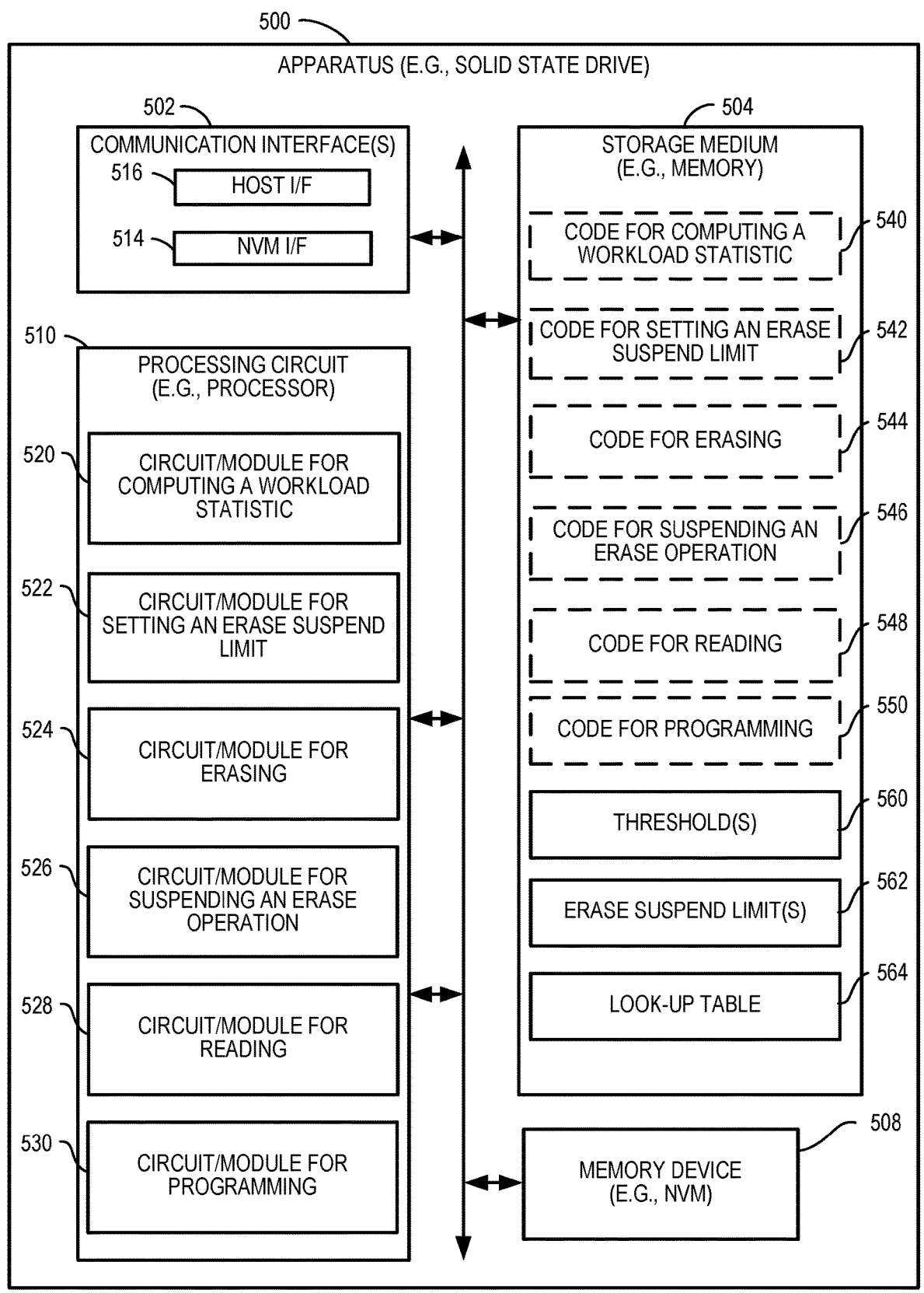
FIG. 5 illustrates an example hardware implementation for an apparatus (e.g., an electronic device) for controlling data storage in accordance with one or more aspects of the disclosure.

FIG. 5 illustrates an aspect of an apparatus 500 configured for controlling data storage according to one or more aspects of the disclosure. The apparatus 500 could embody or be implemented within a memory controller, an SSD, an SSD drive, a host device, an NVM device, a NAND die, or some other type of device that supports data storage. In various implementations, the apparatus 500 could embody or be implemented within a computing device, a personal computer, a portable device, or workstation, a server, a personal digital assistant, a digital camera, a digital phone, an entertainment device, a medical device, or any other electronic device that stores data.

The apparatus 500 includes a communication interface 502, a storage medium 504, a memory device (e.g., an NVM memory circuit) 508, and a processing circuit 510 (e.g., at least one processor and/or other suitable circuitry). These components can be coupled to and/or placed in electrical communication with one another via a signaling bus or other suitable component, represented generally by the connection lines in FIG. 5. The signaling bus may include any number of interconnecting buses and bridges depending on the specific application of the processing circuit 510 and the overall design constraints. The signaling bus links together various circuits such that each of the communication interface 502, the storage medium 504, and the memory device 508 are coupled to and/or in electrical communication with the processing circuit 510. The signaling bus may also link various other circuits (not shown) such as timing sources, peripherals, voltage regulators, and power management circuits, which are well known in the art, and therefore, will not be described any further.

The communication interface 502 provides a means for communicating with other apparatuses over a transmission medium. In some implementations, the communication interface 502 includes circuitry and/or programming (e.g., a program) adapted to facilitate the communication of information bi-directionally with respect to one or more devices in a system. In some implementations, the communication interface 502 may be configured for wire-based communication. For example, the communication interface 502 could be a bus interface, a send/receive interface, or some other type of signal interface including drivers, buffers, or other circuitry for outputting and/or obtaining signals (e.g., outputting signal from and/or receiving signals into an integrated circuit). The communication interface 502 serves as one example of a means for receiving and/or a means for transmitting.

The memory device 508 may represent one or more memory devices. As indicated, the memory device 508 may maintain mapping information 518 along with other information used by the apparatus 500. In some implementations, the memory device 508 and the storage medium 504 are implemented as a common memory component. The memory device 508 may also be used for storing data that is manipulated by the processing circuit 510 or some other component of the apparatus 500.

The storage medium 504 may represent one or more computer-readable, machine-readable, and/or processor-readable devices for storing programming, such as processor executable code or instructions (e.g., software, firmware), electronic data, databases, or other digital information. The storage medium 504 may also be used for storing data that is manipulated by the processing circuit 510 when executing programming. The storage medium 504 may be any available media that can be accessed by a general purpose or special purpose processor, including portable or fixed storage devices, optical storage devices, and various other mediums capable of storing, containing or carrying programming.

By way of example and not limitation, the storage medium 504 may include a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The storage medium 504 may be embodied in an article of manufacture (e.g., a computer program product). By way of example, a computer program product may include a computer-readable medium in packaging materials. In view of the above, in some implementations, the storage medium 504 may be a non-transitory (e.g., tangible) storage medium. For example, the storage medium 504 may be a non-transitory computer-readable medium storing computer-executable code, including code to perform operations as described herein.

The storage medium 504 may be coupled to the processing circuit 510 such that the processing circuit 510 can read information from, and write information to, the storage medium 504. That is, the storage medium 504 can be coupled to the processing circuit 510 so that the storage medium 504 is at least accessible by the processing circuit 510, including examples where at least one storage medium is integral to the processing circuit 510 and/or examples where at least one storage medium is separate from the processing circuit 510 (e.g., resident in the apparatus 500, external to the apparatus 500, distributed across multiple entities, etc.).

Programming stored by the storage medium 504, when executed by the processing circuit 510, causes the processing circuit 510 to perform one or more of the various functions and/or process operations described herein. For example, the storage medium 504 may include operations configured for regulating operations at one or more hardware blocks of the processing circuit 510, as well as to utilize the communication interface 502 for communication utilizing one or more communication protocols.

The processing circuit 510 is generally adapted for processing, including the execution of such programming stored on the storage medium 504. As used herein, the terms "code" or "programming" shall be construed broadly to include without limitation instructions, instruction sets, data, code, code segments, program code, programs, programming, subprograms, software modules, applications, software applications, software packages, routines, subroutines, objects, executables, threads of execution, procedures, functions, etc., whether referred to as software, firmware, middleware, microcode, hardware description language, or otherwise.

The processing circuit 510 is arranged to obtain, process and/or send data, control data access and storage, issue commands, and control other desired operations. The processing circuit 510 may include circuitry configured to implement desired programming provided by appropriate media in at least one example. For example, the processing circuit 510 may be implemented as one or more processors, one or more controllers, and/or other structure configured to execute executable programming Examples of the processing circuit 510 may include a general purpose processor, a digital signal processor (DSP), an application-specific integrated circuit (ASIC), a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 510 may also be implemented as a combination of computing components, such as a combination of a controller and a microprocessor, a number of microprocessors, one or more microprocessors in conjunction with an ASIC and a microprocessor, or any other number of varying configurations. These examples of the processing circuit 510 are for illustration and other suitable configurations within the scope of the disclosure are also contemplated.

According to one or more aspects of the disclosure, the processing circuit 510 may be adapted to perform any or all of the features, processes, functions, operations and/or routines for any or all of the apparatuses described herein. For example, the processing circuit 510 may be configured to perform any of the steps, functions, and/or processes described with respect to FIGS. 1-4 and 6-9. As used herein, the term "adapted" in relation to the processing circuit 510 may refer to the processing circuit 510 being one or more of configured, employed, implemented, and/or programmed to perform a particular process, function, operation and/or routine according to various features described herein.

The processing circuit 510 may be a specialized processor, such as an application-specific integrated circuit (ASIC) that serves as a means for (e.g., structure for) carrying out any one of the operations described in conjunction with FIGS. 1-4 and 6-9. The processing circuit 510 serves as one example of a means for sending and/or a means for receiving. In various implementations, the processing circuit 510 may provide and/or incorporate, at least in part, the functionality described above for the controller 108 or the SSD 104 of FIG. 1 or the controller 204 or the data storage device 202 of FIG. 2.

According to at least one example of the apparatus 500, the processing circuit 510 may include one or more of a circuit/module for computing a workload statistic 520, a circuit/module for setting an erase suspend limit 522, a circuit/module for erasing 524, a circuit/module for suspending an erase operation 1626, a circuit/module for reading 528, or a circuit/module for programming 530. In various implementations, the circuit/module for computing a workload statistic 520, the circuit/module for setting an erase suspend limit 522, the circuit/module for erasing 524, the circuit/module for suspending an erase operation 526, the circuit/module for reading 528, or the circuit/module for programming 530 may provide and/or incorporate, at least in part, the functionality described above for the controller 108 of FIG. 1 or the controller 204 of FIG. 2.

As mentioned above, a program stored by the storage medium 504, when executed by the processing circuit 510, causes the processing circuit 510 to perform one or more of the various functions and/or process operations described herein. For example, the program may cause the processing circuit 510 to perform the various functions, steps, and/or processes described herein with respect to FIGS. 1-4 and 6-9 in various implementations. As shown in FIG. 5, the storage medium 504 may include one or more of code for computing a workload statistic 540, code for setting an erase suspend limit 542, code for erasing 544, code for suspending an erase operation 546, code for reading 548, or code for programming 550. In various implementations, the code for computing a workload statistic 540, the code for setting an erase suspend limit 542, the code for erasing 544, the code for suspending an erase operation 546, code for reading 548, or the code for programming 550 may be executed or otherwise used to provide the functionality described herein for the circuit/module for computing a workload statistic 520, the circuit/module for setting an erase suspend limit 522, the circuit/module for erasing 524, the circuit/module for suspending an erase operation 526, the circuit/module for reading 528, or the circuit/module for programming 530.

In some examples, the circuit/module for computing a workload statistic 520 may be configured to execute code for computing a workload statistic to compute a workload statistic indicative of the workload experienced by the memory device 508 over time. For example, the circuit/module for computing a workload statistic 520 may be configured to count at least a number of read commands received over a duration of time. The circuit/module for computing a workload statistic 520 may further be configured to count a number of program/write commands received over the same duration of time. Based on the number of read commands or the number of read commands and write commands, the circuit/module for computing a workload statistic 520 may be configured to compute the workload statistic. Examples of workload statistics may include, but are not limited to, an average interval between consecutive read operations performed over the duration of time, an average number of read operations performed over the duration of time, or a ratio of write operations to read operations (or a ratio of read operations to write operations) performed over the duration of time. The duration of time may be any suitable time interval, and in some examples, may be between 5 seconds and 1 minute. In some examples, the circuit/module for computing a workload statistic 520 may periodically update the workload statistic.

In some examples, the circuit/module for setting an erase suspend limit 522 may be configured to execute the code for setting an erase suspend limit 542 to set a maximum number of erase suspend operations allowed to performed within an erase pulse of an erase operation. For example, the circuit/module for setting an erase suspend limit 522 may compare the computed workload statistic to one or more threshold(s) 560 that may be maintained, for example, in the storage medium 504. Based on the results of the comparison(s), the circuit/module for setting an erase suspend limit 522 may set the erase suspend limit (e.g., the maximum number of erase suspend operations allowed to be performed within an erase pulse of an erase operation). In some examples, the storage medium 504 may store one or more erase suspend limit(s) 562 from which the circuit/module for setting an erase suspend limit 522 may select based on the comparisons between the computed workload statistic and the workload threshold(s) 560.

In examples in which a single workload threshold 560 it utilized, the circuit/module for setting an erase suspend limit 522 may set the maximum number of erase suspend commands/operations (e.g., the erase suspend limit 562) to a value greater than zero when the workload statistic compares favorably to the workload threshold. The maximum number of erase suspend commands/operations may be any suitable number, and in some examples, may be between one and twenty erase suspends. The circuit/module for setting an erase suspend limit 522 may further set the maximum number of erase suspend command/operations (e.g., the erase suspend limit 562) to zero, thereby preventing erase suspend commands from being generated (or, similarly, erase suspend operations from being performed), when the workload statistic compares unfavorably to the workload threshold.

For example, when the workload statistic includes an average read interval, the circuit/module for setting an erase suspend limit 522 may set the maximum number of erase suspend command/operations to a value greater than zero when the average read interval is longer than (e.g., greater than or equal to) the read interval threshold. Similarly, the circuit/module for setting an erase suspend limit 522 may set the maximum number of erase suspend command/operations to zero when the average read interval is shorter than (e.g., less than) the read interval threshold. As another example, when the workload statistic includes an average number of read operations, the circuit/module for setting an erase suspend limit 522 may set the maximum number of erase suspend command/operations to a value greater than zero when the average number of read operations is less than the read number threshold. Similarly, the circuit/module for setting an erase suspend limit 522 may set the maximum number of erase suspend command/operations to zero when the average number of read operations is greater than or equal to the read number threshold.

In some examples, the circuit/module for setting an erase suspend limit 522 may set the erase suspend limit(s) 562 based on a predetermined look-up table 564 of workloads (or workload ranges) and associated erase suspend limits (e.g., maximum number of allowed erase suspend operations). For example, the circuit/module for setting an erase suspend limit 522 may compare the computed workload statistic to the one or more workload thresholds 560, and the results of the comparisons may be associated with different erase suspend limits 562 in the look-up table 564. As an example, if the workload statistic compares unfavorably to a first workload threshold and compares favorably to a second workload threshold, the circuit/module for setting an erase suspend limit 522 may select the erase suspend limit 562 corresponding in the look-up table 564 to a workload statistic that compares unfavorably to the first workload threshold and compares favorably to the second workload threshold.

In some examples, the circuit/module for erasing 524 may be configured to execute code for erasing 544 to initiate an erase operation to erase a block on the memory device 508. The erase operation may include a series of erase (voltage) pulses to return the memory cells in the block to the erased state. During one of the erase pulses, one or more read and/or program commands may be received from the host device via the host I/F 516 (e.g., one or more read and/or program commands may be placed by the host device in a queue for the apparatus 500). In this example, the circuit/module for suspending an erase operation 526 may be configured to execute code for suspending an erase operation 546 to determine whether to interrupt the erase pulse of the erase operation to execute the read/program operation.

In some examples, the circuit/module for suspending an erase operation 526 may determine the erase suspend limit 562 set by the circuit/module for setting an erase suspend limit 522 and ascertain whether the erase suspend limit 562 is greater than zero. If the erase suspend limit 562 is not greater than zero, the circuit/module for suspending an erase operation 526 may prevent the read/program operation(s) from being performed during the erase pulse. However, if the erase suspend limit 562 is greater than zero, the circuit/module for suspending an erase operation 526 may identify a number of previously performed erase suspend operations during the same erase pulse. If the number of previously performed erase suspend operations is less than the erase suspend limit 562, the circuit/module for suspending an erase operation 526 may interrupt the erase operation to allow the read/program command(s) in the queue to be executed by the circuit/module for reading 528 and/or the circuit/module for programming 530.

Figure 6:
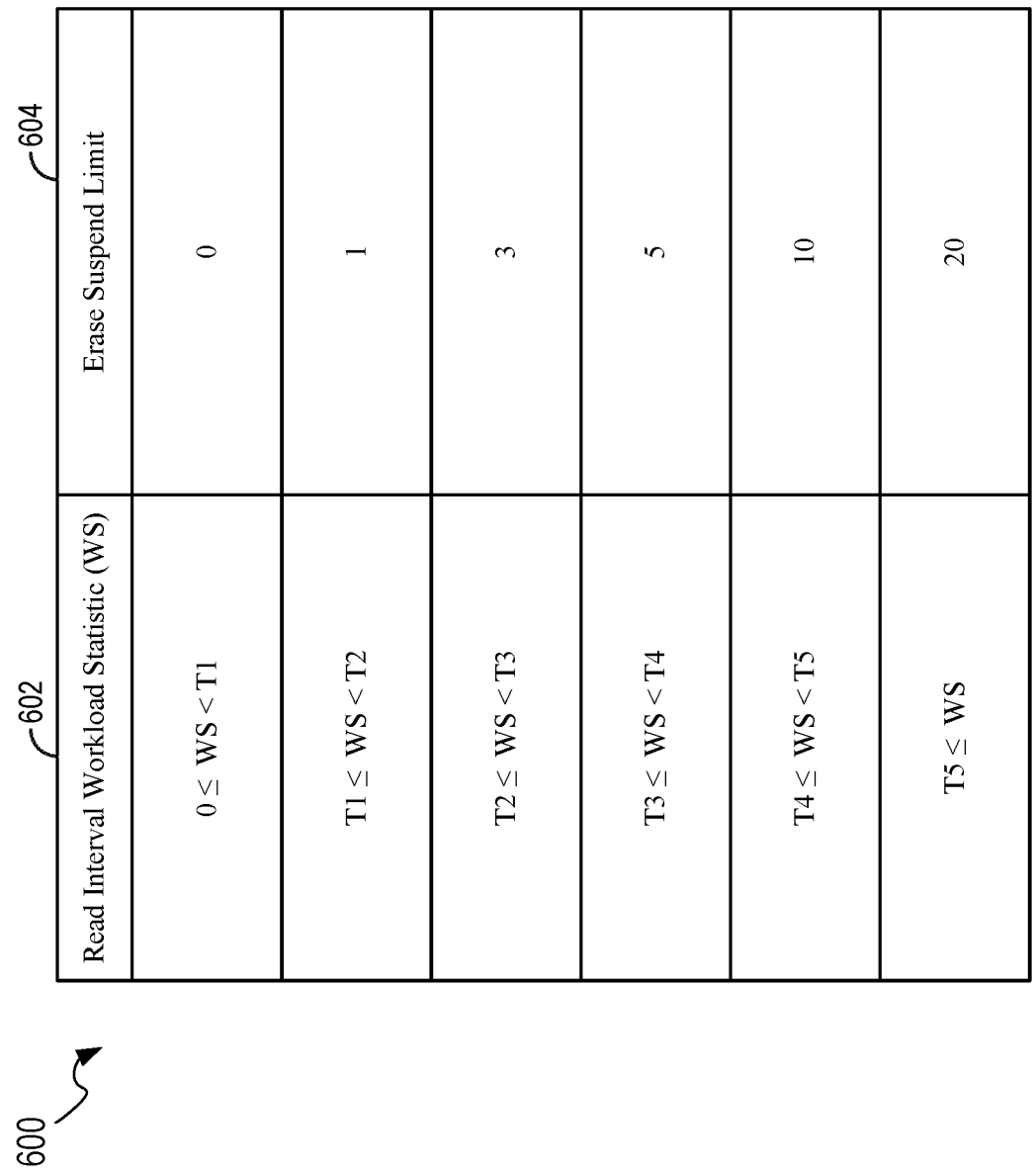
FIG. 6 illustrates an example of a look-up table of workload statistics and erase suspend limits in accordance with one or more aspects of the disclosure.

However, if the number of previously performed erase suspend operations is equal to the erase suspend limit 562, the circuit/module for suspending an erase operation 526 may be configured to prevent the read/program commands from being executed during the erase pulse. In this example, the circuit/module for reading 528 and/or the circuit/module for programming 530 may wait until the end of the erase pulse to execute the read/program commands Example Look-Up Table FIG. 6 illustrates an example of a look-up table 600 of workload statistics 602 and erase suspend limits 604. In the example shown in FIG. 6, there are six erase suspend limits 604, each associated with a different workload statistic range. Each workload statistic range is defined based on one or more workload thresholds (e.g., T1-T5), and is representative of a range of average read intervals. The first threshold (T1) represents the lowest threshold (e.g., the shortest average read interval), whereas the last threshold (T5) represents the highest threshold (e.g., the longest average read interval). For example, when the average read interval workload statistic (WS) is less than the first threshold (T1), but greater than or equal to zero, this indicates a read intensive workload on the NAND device (e.g., a short average interval between read operations). Therefore, when the WS falls into the range of $0 \leq WS < T1$, the erase suspend limit may be set to zero, thereby preventing erase suspend operations from being performed within any erase pulse of an erase operation.

When the read interval WS exceeds T1, the workload on the NAND device is less intensive, and therefore, one or more erase suspend operations may be allowed during each erase pulse. For example, when the WS falls into the range of $T1 \leq WS < T2$, an erase suspend limit of one may be set, thereby allowing one erase suspend operation to be performed during each erase pulse. Similarly, when the WS falls into the range of $T2 \leq WS < T3$, an erase suspend limit of 3 may be set, thereby allowing three erase suspend operations to be performed during erase pulse. Erase suspend limits of five, ten, and twenty may also be set based on additional thresholds (T4 and T5). It should be understood that during each erase suspend operation, one or more read and/or program operations may be performed based on the QD. The erase suspend limits and workload thresholds shown in FIG. 6 are merely illustrative, and any suitable number of erase suspend limits, thresholds and erase suspend values may be populated in the look-up table 600.

First Example Process

Figure 7:
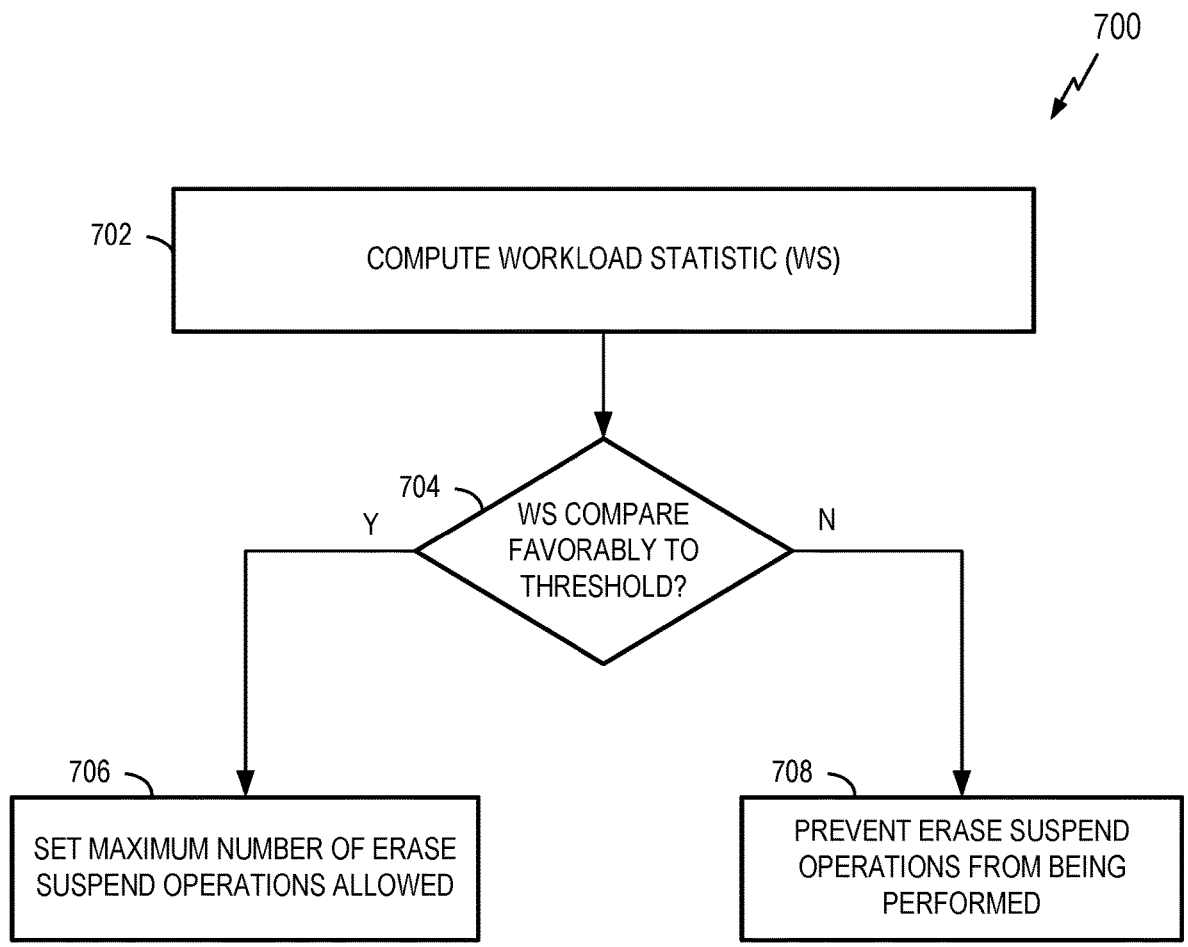
FIG. 7 illustrates an example process for adapting the number of erase suspends in accordance with one or more aspects of the disclosure.

FIG. 7 illustrates a process 700 for adapting the number of erase suspends in accordance with some aspects of the disclosure. The process 700 may take place within a processing circuit (e.g., the processing circuit 510 of FIG. 5), which may be located in a controller, an SSD, an SSD drive, a host device, an NVM device, a NAND die, or some other suitable apparatus. Of course, in various aspects within the scope of the disclosure, the process 700 may be implemented by any suitable apparatus capable of supporting memory-related operations.

At block 702, an apparatus (e.g., a solid state drive) may compute a workload statistic indicative of a workload of a non-volatile memory array (e.g., an array of an NVM device of a solid state drive). In some examples, the workload statistic may be computed based on at least a number of read operations performed over a duration of time. For example, the workload statistic may be an average interval between consecutive read operations performed over the duration of time, an average number of read operations performed over the duration of time, or a ratio of write operations to read operations (or a ratio of read operations to write operations) performed over the duration of time. The duration of time may be any suitable time interval, and in some examples, may be between 5 seconds and 1 minute.

At block 704, the apparatus may compare the computed workload statistic to a workload threshold. In some examples, the workload threshold may include two or more thresholds, each representing a different range of workload statistics.

If the workload statistic compares favorably to the workload threshold (Y branch of block 704), at block 706, the apparatus may set a maximum number erase suspend operations that may be performed during an erase pulse of an erase operation (e.g., an erase suspend limit). The maximum number of erase suspend operations is greater than zero to enable at least one erase suspend operation to be performed during an erase pulse. In examples in which two or more workload thresholds are utilized, the maximum number of erase suspend operations may be variable based on the respective comparisons between the workload statistics and the workload thresholds.

If the workload statistic compares unfavorably to the workload threshold (N branch of block 704), at block 708, the apparatus may prevent erase suspend operations from being performed during any erase pulse of an erase operation. In some examples, the apparatus may prevent erase suspend operations when the NVM device is experiencing an intensive read workload.

Second Example Process

Figure 8:
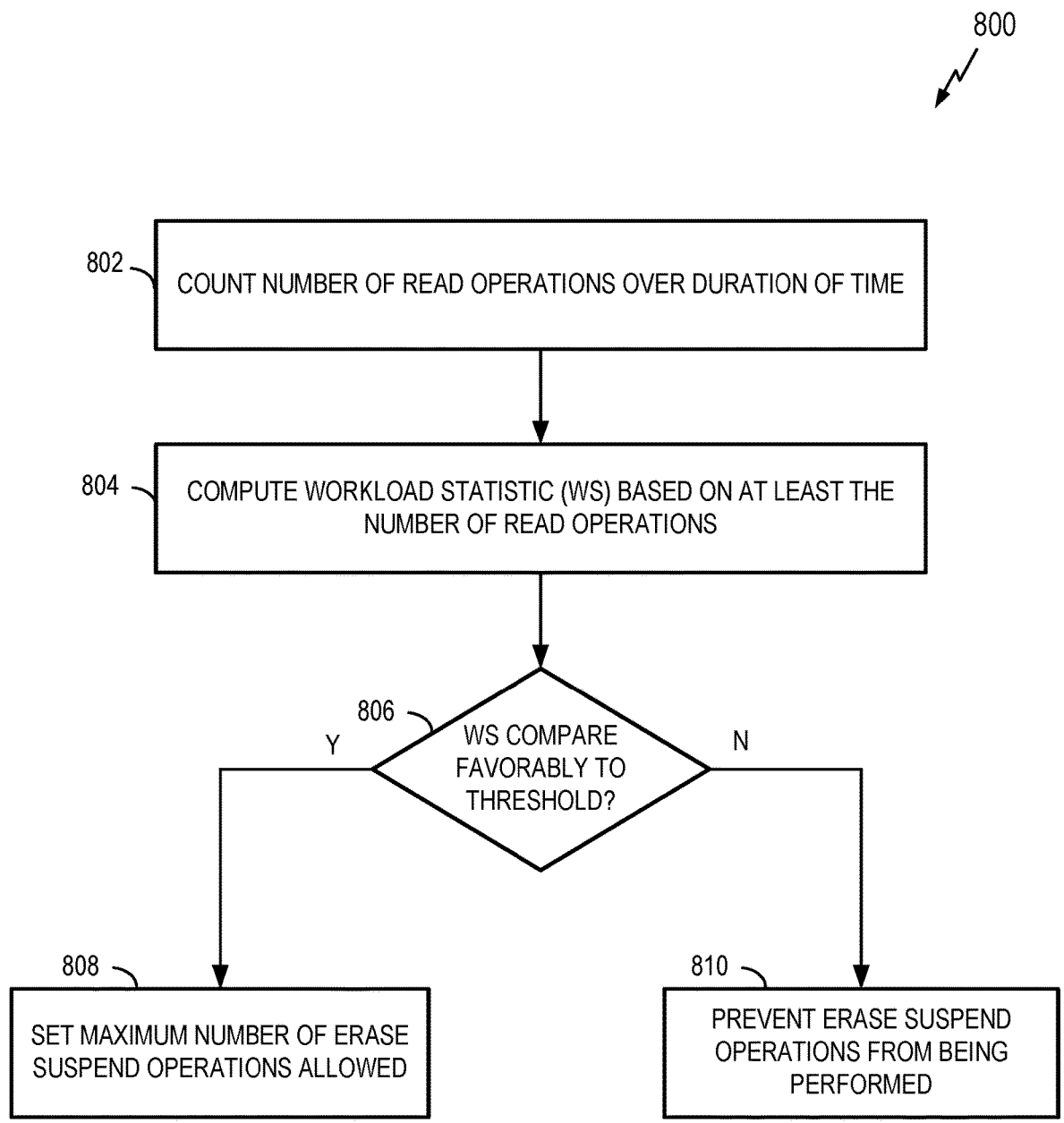
FIG. 8 illustrates another example process for adapting the number of erase suspends in accordance with one or more aspects of the disclosure.

FIG. 8 illustrates a process 800 for adapting the number of erase suspends in accordance with some aspects of the disclosure. The process 800 may take place within a processing circuit (e.g., the processing circuit 510 of FIG. 5), which may be located in a controller, an SSD, an SSD drive, a host device, an NVM device, a NAND die, or some other suitable apparatus. Of course, in various aspects within the scope of the disclosure, the process 800 may be implemented by any suitable apparatus capable of supporting memory-related operations.

At block 802, an apparatus (e.g., a solid state drive) may count a number of read operations performed on one or more die of an NVM over a duration of time. The duration of time may be any suitable time interval, and in some examples, may be between 5 seconds and 1 minute.

At block 804, the apparatus may compute a workload statistic based on the number of read operations. In an example, the workload statistic may be computed as an average interval between consecutive read operations performed over the duration of time. For example, the workload statistic (WS) may be computed as: WS=time_interval/ (total_number_reads/number_dies).

At block 806, the apparatus may compare the computed workload statistic to a workload threshold. In some examples, the workload threshold may include two or more thresholds, each representing a different range of workload statistics.

If the workload statistic compares favorably to the workload threshold (Y branch of block 806), at block 808, the apparatus may set a maximum number erase suspend operations that may be performed during an erase pulse of an erase operation (e.g., an erase suspend limit). The maximum number of erase suspend operations is greater than zero to enable at least one erase suspend operation to be performed during an erase pulse. In examples in which two or more workload thresholds are utilized, the maximum number of erase suspend operations may be variable based on the respective comparisons between the workload statistics and the workload thresholds.

If the workload statistic compares unfavorably to the workload threshold (N branch of block 806), at block 810, the apparatus prevents erase suspend operations from being performed during any erase pulse of an erase operation. In some examples, the apparatus may prevent erase suspend operations when the NVM device is experiencing an intensive read workload.

In an aspect, when the workload statistic is computed as an average read interval, the maximum number of erase suspend operations may be set when the average read interval is longer than (e.g., greater than or equal to) the read interval threshold. Similarly, erase suspend operations may be prevents when the average read interval is shorter than (e.g., less than) the read interval threshold.

Third Example Process

Figure 9:
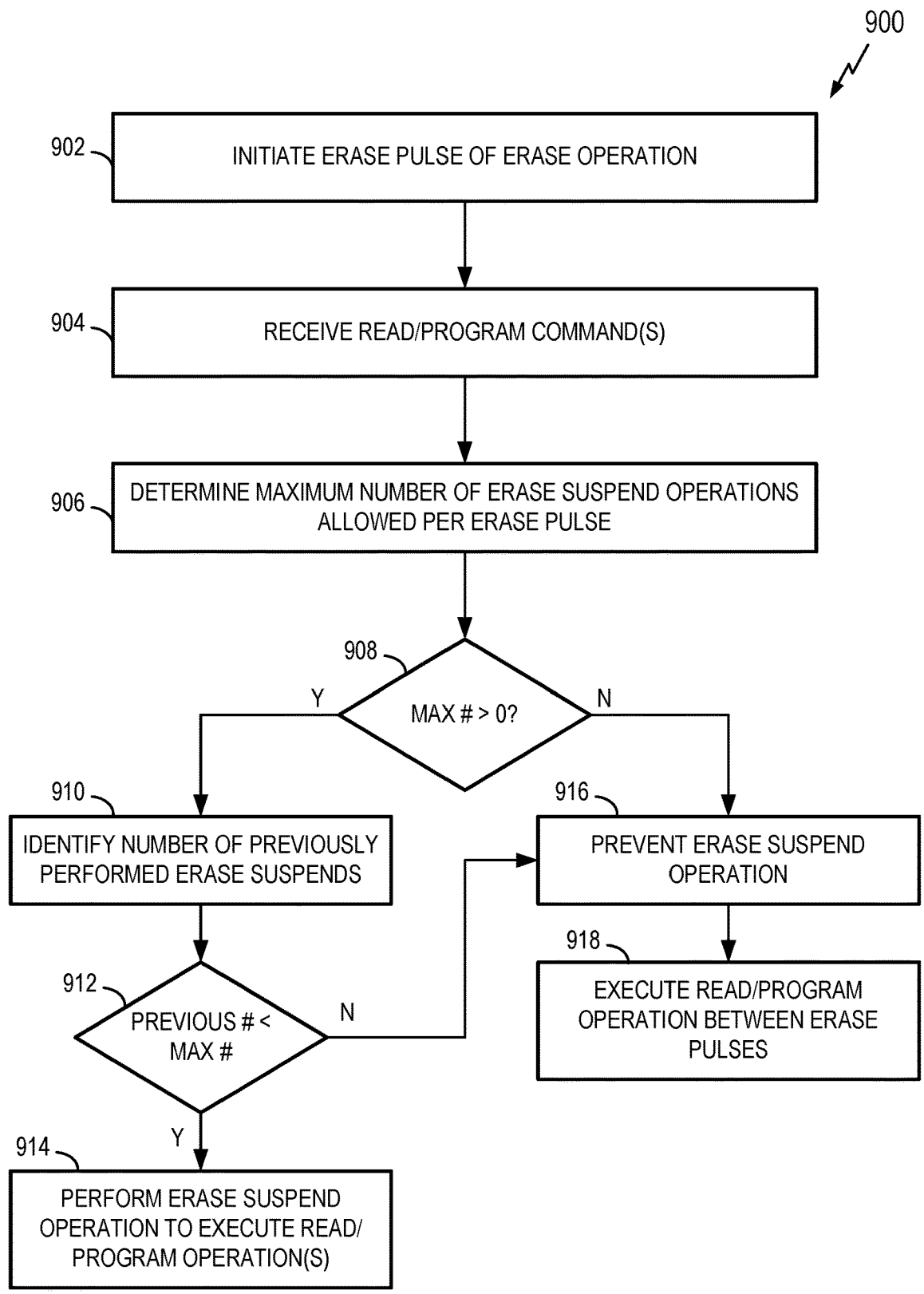
FIG. 9 illustrates an example process for controlling data operations in accordance with one or more aspects of the disclosure.

FIG. 9 illustrates a process 900 for controlling data operations in accordance with some aspects of the disclosure. The process 900 may take place within a processing circuit (e.g., the processing circuit 510 of FIG. 5), which may be located in a controller, an SSD, an SSD drive, a host device, an NVM device, a NAND die, or some other suitable apparatus. Of course, in various aspects within the scope of the disclosure, the process 900 may be implemented by any suitable apparatus capable of supporting memory-related operations.

At block 902, an apparatus (e.g., a solid state drive) may initiate an erase pulse of an erase operation on a block on an NVM. For example, the apparatus may receive an erase command from a host device and execute an erase operation on the NVM to erase a block on the NVM. The erase operation may include a series of erase (voltage) pulses to return the memory cells in the block to the erased state.

At block 904, during one of the erase pulses, the apparatus may receive one or more read/program commands In some examples, the number of read commands that may be received may be based on the queue depth (QD) of the apparatus.

At block 906, the apparatus may determine the maximum number of erase suspend operations allowed per erase pulse (MAX #). In some examples, the maximum number of erase suspend operations is dynamically set based on the current workload of the NMV.

If the maximum number of erase suspend operations (MAX #) is greater than zero (Y branch of block 908), at block 910, the apparatus may identify the number of erase operations previously performed during the erase pulse (PREY #).

If the number of erase operations previously performed (PREY #) is less than the maximum number of erase operations (MAX #) (Y branch of block 912), at block 914, the apparatus may perform an erase suspend operation to interrupt the erase operation and execute the received read/ program operations on the NVM.

However, if the number of erase operations previously performed is not less than (e.g., is equal to) the maximum number of erase operations (N branch of block 912) or if the maximum number of erase operations is not greater than zero (e.g., is equal to zero) (N branch of block 908), at block 916, the apparatus may prevent an erase suspend operation from being performed during the erase pulse. At block 918, the apparatus may then execute the read/program operations between erase pulses (e.g., between the current erase pulse and a next erase pulse).

Additional Aspects

The examples set forth herein are provided to illustrate certain concepts of the disclosure. The apparatuses, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Aspects of the present disclosure have been described above with reference to schematic flowchart diagrams and/or schematic block diagrams of methods, apparatuses, systems, and computer program products according to aspects of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable medium having stored thereon computer executable instructions that when executed by a computer (e.g., a processor) control the computer to perform the functionality described herein. Examples of computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding aspects. For instance, an arrow may indicate a waiting or monitoring period of unspecified duration between enumerated steps of the depicted aspect.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner Tasks or events may be added to or removed from the disclosed example aspects. The example systems and components described herein may be configured differently than described. For example, elements may be added to, removed from, or rearranged compared to the disclosed example aspects.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

While the above descriptions contain many specific aspects of the invention, these should not be construed as limitations on the scope of the invention, but rather as examples of specific aspects thereof. Accordingly, the scope of the invention should be determined not by the aspects illustrated, but by the appended claims and their equivalents. Moreover, reference throughout this specification to "one aspect," "an aspect," or similar language means that a particular feature, structure, or characteristic described in connection with the aspect is included in at least one aspect of the present disclosure. Thus, appearances of the phrases "in one aspect," "in an aspect," and similar language throughout this specification may, but do not necessarily, all refer to the same aspect, but mean "one or more but not all aspects" unless expressly specified otherwise.

The terminology used herein is for the purpose of describing particular embodiments only and is not intended to be limiting of the embodiments. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," an variations thereof when used herein mean "including but not limited to" unless expressly specified otherwise. That is, these terms may specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of a, b, or c" or "a, b, c, or any combination thereof" used in the description or the claims means "a or b or c or any combination of these elements." For example, this terminology may include a, or b, or c, or a and b, or a and c, or a and b and c, or 2a, or 2b, or 2c, or 2a and b, and so on.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

What is claimed is:

1. A data storage apparatus, comprising:
   a non-volatile memory; and
   a processor coupled to the non-volatile memory and configured to:
     compute a workload statistic based on at least a number of read operations performed on the non-volatile memory over a duration of time,
     compare the workload statistic with a workload threshold,
     set a maximum number of erase suspend operations allowed to be performed within each of a plurality of erase pulses of an erase operation when the workload statistic compares favorably to the workload threshold, wherein the maximum number of erase suspend operations is greater than zero,
     prevent erase suspend operations from being performed within any of the plurality of erase pulses when the workload statistic compares unfavorably to the workload threshold;
     initiate a first erase pulse of the plurality of erase pulses of the erase operation;
     receive a first read operation to performed on the non-volatile memory;
     if the workload statistic compares unfavorably to the workload threshold, prevent the first read operation from being executed during the first erase pulse; and
     execute the first read operation between the first erase pulse and a second erase pulse of the plurality of erase pulses of the erase operation.

2. The apparatus of claim 1, wherein the workload threshold comprises a first workload threshold and a second workload threshold, and wherein the setting of the maximum number of erase suspend operations comprises:
   setting a first maximum number of erase suspend operations allowed to be performed within each of the plurality of erase pulses of the erase operation when the workload statistic compares favorably to the first workload threshold; and
   setting a second maximum number of erase suspend operations allowed to be performed within each of the plurality of erase pulses of the erase operation when the workload statistic compares unfavorably to the first workload threshold and compares favorably to the second workload threshold.

3. The apparatus of claim 2, wherein the second maximum number of erase suspend operations is less than the first maximum number of erase suspend operations.

4. The apparatus of claim 2, further comprising:
   an additional memory comprising a look-up table, wherein the processor is further configured to access the look-up table to identify the first maximum number of erase suspend operations and the second maximum number of erase suspend operations.

5. The apparatus of claim 1, wherein the computation of the workload statistic comprises computing an average interval between consecutive read operations performed during the duration of time.

6. The apparatus of claim 1, wherein the computation of the workload statistic comprises computing an average number of read operations performed during the duration of time.

7. The apparatus of claim 1, wherein the computation of the workload statistic comprises computing a ratio of write operations to read operations performed during the duration of time.

8. The apparatus of claim 1, wherein the maximum number of erase suspend operations is less than or equal to twenty.

9. The apparatus of claim 1, wherein the processor is further configured to:
   initiate a first erase pulse of the plurality of erase pulses of the erase operation;
   receive a first read operation to performed on the non-volatile memory;
   identify a number of previously performed erase suspend operations during the first erase pulse; and
   if the workload statistic compares favorably to the workload threshold, perform a first erase suspend operation to execute the first read operation when the number of previously performed erase suspend operations is less than the maximum number of erase suspend operations.

10. The apparatus of claim 1, wherein:
    the workload statistic comprises an average interval between consecutive read operations performed during the duration of time;
    the workload threshold comprises a read interval threshold; and
    the workload statistic compares favorably to the workload threshold when the workload statistic is greater than or equal to the read interval threshold.

11. A data storage method, comprising:
    counting a number of read operations performed on a non-volatile memory over a duration of time;
    computing a workload statistic based on at least the number of read operations;
    comparing the workload statistic with a workload threshold;
    setting a maximum number of erase suspend operations allowed to be performed within each of a plurality of erase pulses of an erase operation when the workload statistic compares favorably to the workload threshold, wherein the maximum number of erase suspend operations is greater than zero;
    preventing erase suspend operations from being performed within any of the plurality of erase pulses when the workload statistic compares unfavorably to the workload threshold;
    initiating a first erase pulse of the plurality of erase pulses of the erase operation;
    receiving a first read operation to performed on the non-volatile memory;

if the workload statistic compares unfavorably to the workload threshold, preventing the first read operation from being executed during the first erase pulse; and executing the first read operation between the first erase pulse and a second erase pulse of the plurality of erase pulses of the erase operation.

12. The method of claim 11, wherein the workload threshold comprises a first workload threshold and a second workload threshold, and wherein setting the maximum number of erase suspend operations further comprises:

setting a first maximum number of erase suspend operations allowed to be performed within each of the plurality of erase pulses of the erase operation when the workload statistic compares favorably to the first workload threshold; and setting a second maximum number of erase suspend operations allowed to be performed within each of the plurality of erase pulses of the erase operation when the workload statistic compares unfavorably to the first workload threshold and compares favorably to the second workload threshold.

13. The method of claim 11, wherein computing the workload statistic further comprises:

computing an average interval between consecutive read operations performed over the duration of time, computing an average number of read operations performed over the duration of time, or computing a ratio of write operations to read operations performed over the duration of time.

14. The method of claim 11, further comprising:

initiating a first erase pulse of the plurality of erase pulses of the erase operation;

receiving a first read operation to performed on the non-volatile memory;

identifying a number of previously performed erase suspend operations during the first erase pulse; and if the workload statistic compares favorably to the workload threshold, performing a first erase suspend operation to execute the first read operation when the number of previously performed erase suspend operations is less than the maximum number of erase suspend operations.

15. A data storage apparatus, comprising:

means for computing a workload statistic of a non-volatile memory comprising one of an average interval between consecutive read operations performed during a duration of time, an average number of read operations performed during the duration of time, or a ratio of write operations to read operations performed during the duration of time;

means for comparing the workload statistic with a workload threshold;

means for setting a maximum number of erase suspend operations allowed to be performed within each of a plurality of erase pulses of an erase operation when the workload statistic compares favorably to the workload threshold, wherein the maximum number of erase suspend operations is greater than zero;

means for preventing erase suspend operations from being performed within any of the plurality of erase pulses when the workload statistic compares unfavorably to the workload threshold;

means for initiating a first erase pulse of the plurality of erase pulses of the erase operation;

means for receiving a first read operation to performed on the non-volatile memory;

if the workload statistic compares unfavorably to the workload threshold, means for preventing the first read operation from being executed during the first erase pulse; and means for executing the first read operation between the first erase pulse and a second erase pulse of the plurality of erase pulses of the erase operation.

16. The apparatus of claim 15, wherein the workload threshold comprises a first workload threshold and a second workload threshold, and wherein the means for setting the maximum number of erase suspend operations further comprises:

means for setting a first maximum number of erase suspend operations allowed to be performed within each of the plurality of erase pulses of the erase operation when the workload statistic compares favorably to the first workload threshold; and means for setting a second maximum number of erase suspend operations allowed to be performed within each of the plurality of erase pulses of the erase operation when the workload statistic compares unfavorably to the first workload threshold and compares favorably to the second workload threshold.

17. The apparatus of claim 15, further comprising:

means for initiating a first erase pulse of the plurality of erase pulses of the erase operation;

means for receiving a first read operation to performed on the non-volatile memory;

means for identifying a number of previously performed erase suspend operations during the first erase pulse; and if the workload statistic compares favorably to the workload threshold, means for performing a first erase suspend operation to execute the first read operation when the number of previously performed erase suspend operations is less than the maximum number of erase suspend operations.

* * * * *